(12) United States Patent
Holden et al.

(10) Patent No.: US 10,652,067 B2
(45) Date of Patent: May 12, 2020

(54) ORTHOGONAL DIFFERENTIAL VECTOR SIGNALING CODES WITH EMBEDDED CLOCK

(71) Applicant: Kandou Labs, S.A., Lausanne (CH)

(72) Inventors: Brian Holden, Monte Sereno, CA (US); Amin Shokrollahi, Préverenges (CH)

(73) Assignee: KANDOU LABS, S.A., Lausanne (CH)

( * ) Notice: Subject to any disclaimer, the term of this patent is extended or adjusted under 35 U.S.C. 154(b) by 0 days.

(21) Appl. No.: 16/180,953

(22) Filed: Nov. 5, 2018

(65) Prior Publication Data

US 2019/0075004 A1    Mar. 7, 2019

Related U.S. Application Data

(63) Continuation of application No. 15/829,904, filed on Dec. 2, 2017, now Pat. No. 10,122,561, which is a
(Continued)

(51) Int. Cl.
| | |
|---|---|
| *H04L 27/26* | (2006.01) |
| *G11C 7/10* | (2006.01) |
| *G11C 7/22* | (2006.01) |
| *G11C 11/4076* | (2006.01) |
| *G11C 11/4093* | (2006.01) |

(Continued)

(52) U.S. Cl.
CPC ........ *H04L 27/2637* (2013.01); *G06F 13/426* (2013.01); *G11C 7/1006* (2013.01); *G11C 7/1066* (2013.01); *G11C 7/1093* (2013.01); *G11C 7/222* (2013.01); *G11C 11/4076* (2013.01); *G11C 11/4093* (2013.01);
(Continued)

(58) Field of Classification Search
CPC .. H04L 27/2637; G06F 13/426; G11C 7/1006
See application file for complete search history.

(56) References Cited

U.S. PATENT DOCUMENTS

| | | |
|---|---|---|
| 3,196,351 A | 7/1965 | David |
| 3,970,795 A | 7/1976 | Allen |

(Continued)

FOREIGN PATENT DOCUMENTS

| | | |
|---|---|---|
| CN | 1864346 A | 11/2006 |
| CN | 101854223 A | 10/2010 |

(Continued)

OTHER PUBLICATIONS

Abbasfar, Aliazam, "Generalized Differential Vector Signaling", IEEE International Conference on Communications, ICC '09, Jun. 14, 2009, 1-5 (5 pages).
(Continued)

*Primary Examiner* — Jaison Joseph
(74) *Attorney, Agent, or Firm* — Invention Mine LLC

(57) ABSTRACT

Orthogonal differential vector signaling codes are described which support encoded sub-channels allowing transport of distinct but temporally aligned data and clocking signals over the same transport medium. Embodiments providing enhanced LPDDR interfaces are described which are suitable for implementation in both conventional high-speed CMOS and DRAM integrated circuit processes.

16 Claims, 10 Drawing Sheets

Related U.S. Application Data continuation of application No. 15/285,316, filed on Oct. 4, 2016, now Pat. No. 9,838,234, which is a continuation of application No. 14/816,896, filed on Aug. 3, 2015, now Pat. No. 9,461,862.

(60) Provisional application No. 62/032,175, filed on Aug. 1, 2014.

(51) Int. Cl.
*H04L 25/49* (2006.01)
*G06F 13/42* (2006.01)

(52) U.S. Cl.
CPC .......... *H04L 25/4919* (2013.01); *Y02D 10/14* (2018.01); *Y02D 10/151* (2018.01)

(56) References Cited

U.S. PATENT DOCUMENTS

| | | |
|---|---|---|
| 4,163,258 A | 7/1979 | Ebihara et al. |
| 4,499,550 A | 2/1985 | Ray et al. |
| 5,053,974 A | 10/1991 | Penz |
| 5,166,956 A | 11/1992 | Baltus et al. |
| 5,311,516 A | 5/1994 | Kuznicki et al. |
| 5,331,320 A | 7/1994 | Cideciyan et al. |
| 5,412,689 A | 5/1995 | Chan et al. |
| 5,449,895 A | 9/1995 | Hecht et al. |
| 5,461,379 A | 10/1995 | Weinman |
| 5,511,119 A | 4/1996 | Lechleider |
| 5,553,097 A | 9/1996 | Dagher |
| 5,856,935 A | 1/1999 | Moy et al. |
| 5,982,954 A | 11/1999 | Delen et al. |
| 6,005,895 A | 12/1999 | Perino et al. |
| 6,084,883 A | 7/2000 | Norrell et al. |
| 6,084,958 A | 7/2000 | Blossom |
| 6,097,732 A | 8/2000 | Jung |
| 6,154,498 A | 11/2000 | Dabral et al. |
| 6,226,330 B1 | 5/2001 | Mansur |
| 6,278,740 B1 | 8/2001 | Nordyke |
| 6,317,465 B1 | 11/2001 | Akamatsu et al. |
| 6,359,931 B1 | 3/2002 | Perino et al. |
| 6,452,420 B1 | 9/2002 | Wong |
| 6,483,828 B1 | 11/2002 | Balachandran et al. |
| 6,504,875 B2 | 1/2003 | Perino et al. |
| 6,556,628 B1 | 4/2003 | Poulton et al. |
| 6,621,427 B2 | 9/2003 | Greenstreet |
| 6,621,945 B2 | 9/2003 | Bissessur |
| 6,650,638 B1 | 11/2003 | Walker et al. |
| 6,661,355 B2 | 12/2003 | Cornelius et al. |
| 6,766,342 B2 | 7/2004 | Kechriotis |
| 6,865,234 B1 | 3/2005 | Agazzi |
| 6,865,236 B1 | 3/2005 | Terry |
| 6,876,317 B2 | 4/2005 | Sankaran |
| 6,898,724 B2 | 5/2005 | Chang |
| 6,927,709 B2 | 8/2005 | Kiehl |
| 6,954,492 B1 | 10/2005 | Williams |
| 6,990,138 B2 | 1/2006 | Bejjani et al. |
| 6,999,516 B1 | 2/2006 | Rajan |
| 7,023,817 B2 | 4/2006 | Kuffner et al. |
| 7,039,136 B2 | 5/2006 | Olson et al. |
| 7,053,802 B2 | 5/2006 | Cornelius |
| 7,075,996 B2 | 7/2006 | Simon et al. |
| 7,127,003 B2 | 10/2006 | Rajan et al. |
| 7,142,612 B2 | 11/2006 | Horowitz et al. |
| 7,167,019 B2 | 1/2007 | Broyde et al. |
| 7,167,523 B2 | 1/2007 | Mansur |
| 7,180,949 B2 | 2/2007 | Kleveland et al. |
| 7,184,483 B2 | 2/2007 | Rajan |
| 7,269,212 B1 | 9/2007 | Chau et al. |
| 7,356,213 B1 | 4/2008 | Cunningham et al. |
| 7,358,869 B1 | 4/2008 | Chiarulli et al. |
| 7,400,276 B1 | 7/2008 | Sotiriadis et al. |
| 7,535,957 B2 | 5/2009 | Ozawa et al. |
| 7,583,209 B1 | 9/2009 | Duan |
| 7,613,234 B2 | 11/2009 | Raghavan et al. |
| 7,620,116 B2 | 11/2009 | Bessios et al. |
| 7,633,850 B2 | 12/2009 | Ann |
| 7,656,321 B2 | 2/2010 | Wang |
| 7,706,456 B2 | 4/2010 | Laroia et al. |
| 7,706,524 B2 | 4/2010 | Zerbe |
| 7,746,764 B2 | 6/2010 | Rawlins et al. |
| 7,841,909 B2 | 11/2010 | Murray et al. |
| 7,868,790 B2 | 1/2011 | Bae |
| 7,869,546 B2 | 1/2011 | Tsai |
| 7,899,653 B2 | 3/2011 | Hollis |
| 8,050,332 B2 | 11/2011 | Chung et al. |
| 8,055,095 B2 | 11/2011 | Palotai et al. |
| 8,064,535 B2 | 11/2011 | Wiley |
| 8,085,172 B2 | 12/2011 | Li et al. |
| 8,149,906 B2 | 4/2012 | Saito et al. |
| 8,159,375 B2 | 4/2012 | Abbasfar |
| 8,159,376 B2 | 4/2012 | Abbasfar |
| 8,199,849 B2 | 6/2012 | Oh et al. |
| 8,199,863 B2 | 6/2012 | Chen et al. |
| 8,218,670 B2 | 7/2012 | Abou |
| 8,245,094 B2 | 8/2012 | Jiang et al. |
| 8,274,311 B2 | 9/2012 | Liu |
| 8,279,094 B2 | 10/2012 | Abbasfar |
| 8,279,745 B2 | 10/2012 | Dent |
| 8,279,976 B2 | 10/2012 | Lin et al. |
| 8,284,848 B2 | 10/2012 | Nam et al. |
| 8,289,914 B2 | 10/2012 | Li et al. |
| 8,295,250 B2 | 10/2012 | Gorokhov et al. |
| 8,365,035 B2 | 1/2013 | Hara |
| 8,442,099 B1 | 5/2013 | Sederat |
| 8,442,210 B2 | 5/2013 | Zerbe |
| 8,451,913 B2 | 5/2013 | Oh et al. |
| 8,472,513 B2 | 6/2013 | Malipatil et al. |
| 8,498,344 B2 | 7/2013 | Wilson et al. |
| 8,498,368 B1 | 7/2013 | Husted et al. |
| 8,520,493 B2 | 8/2013 | Goulahsen |
| 8,539,318 B2 | 9/2013 | Shokrollahi et al. |
| 8,577,284 B2 | 11/2013 | Seo et al. |
| 8,588,254 B2 | 11/2013 | Diab et al. |
| 8,588,280 B2 | 11/2013 | Oh et al. |
| 8,593,305 B1 | 11/2013 | Tajalli et al. |
| 8,620,166 B2 | 12/2013 | Guha |
| 8,638,241 B2 | 1/2014 | Sudhakaran et al. |
| 8,644,497 B2 | 2/2014 | Clausen et al. |
| 8,649,445 B2 | 2/2014 | Cronie et al. |
| 8,649,460 B2 | 2/2014 | Ware et al. |
| 8,687,968 B2 | 4/2014 | Nosaka et al. |
| 8,718,184 B1 * | 5/2014 | Cronie .................... G06F 13/42 375/295 |
| 8,755,426 B1 * | 6/2014 | Cronie .................... H04B 1/10 375/232 |
| 8,773,964 B2 | 7/2014 | Hsueh et al. |
| 8,780,687 B2 | 7/2014 | Clausen et al. |
| 8,831,440 B2 | 9/2014 | Yu et al. |
| 8,879,660 B1 | 11/2014 | Peng et al. |
| 8,938,171 B2 | 1/2015 | Tang et al. |
| 8,949,693 B2 | 2/2015 | Ordentlich et al. |
| 8,951,072 B2 | 2/2015 | Hashim et al. |
| 8,989,317 B1 * | 3/2015 | Holden ............... H04L 25/0272 375/295 |
| 8,996,740 B2 | 3/2015 | Wiley et al. |
| 9,015,566 B2 | 4/2015 | Cronie et al. |
| 9,069,995 B1 | 6/2015 | Cronie |
| 9,071,476 B2 | 6/2015 | Fox et al. |
| 9,077,386 B1 | 7/2015 | Holden et al. |
| 9,093,791 B2 | 7/2015 | Liang |
| 9,100,232 B1 | 8/2015 | Hormati et al. |
| 9,124,557 B2 | 9/2015 | Fox et al. |
| 9,165,615 B2 | 10/2015 | Amirkhany et al. |
| 9,197,470 B2 | 11/2015 | Okunev |
| 9,231,790 B2 | 1/2016 | Wiley et al. |
| 9,246,713 B2 | 1/2016 | Shokrollahi |
| 9,251,873 B1 | 2/2016 | Fox et al. |
| 9,288,082 B1 | 3/2016 | Ulrich et al. |
| 9,288,089 B2 | 3/2016 | Cronie et al. |
| 9,331,962 B2 | 5/2016 | Lida et al. |
| 9,362,974 B2 | 6/2016 | Fox et al. |
| 9,363,114 B2 | 6/2016 | Shokrollahi et al. |
| 9,401,828 B2 | 7/2016 | Cronie et al. |

(56) References Cited

U.S. PATENT DOCUMENTS

| | | | |
|---|---|---|---|
| 9,432,082 | B2 | 8/2016 | Ulrich et al. |
| 9,455,765 | B2 | 9/2016 | Schumacher et al. |
| 9,461,862 | B2 | 10/2016 | Holden et al. |
| 9,479,369 | B1 | 10/2016 | Shokrollahi |
| 9,509,437 | B2 | 11/2016 | Shokrollahi |
| 9,537,644 | B2 | 1/2017 | Jones et al. |
| 9,634,797 | B2 | 4/2017 | Benammar et al. |
| 9,667,379 | B2 | 5/2017 | Cronie et al. |
| 9,710,412 | B2 | 7/2017 | Sengoku |
| 10,055,372 | B2 | 8/2018 | Shokrollahi |
| 2001/0006538 | A1 | 7/2001 | Simon et al. |
| 2002/0044316 | A1 | 4/2002 | Myers |
| 2002/0152340 | A1 | 10/2002 | Dreps et al. |
| 2002/0174373 | A1* | 11/2002 | Chang .............. G06F 13/4072 713/401 |
| 2002/0181607 | A1 | 12/2002 | Izumi |
| 2003/0048210 | A1 | 3/2003 | Kiehl |
| 2003/0086366 | A1 | 5/2003 | Branlund et al. |
| 2003/0117184 | A1 | 6/2003 | Fecteau et al. |
| 2004/0057525 | A1 | 3/2004 | Rajan et al. |
| 2004/0146117 | A1 | 7/2004 | Subramaniam et al. |
| 2004/0155802 | A1 | 8/2004 | Lamy et al. |
| 2004/0161019 | A1 | 8/2004 | Raghavan et al. |
| 2004/0170231 | A1 | 9/2004 | Bessios et al. |
| 2004/0239374 | A1 | 12/2004 | Hori |
| 2005/0213686 | A1 | 9/2005 | Love et al. |
| 2006/0013331 | A1 | 1/2006 | Choi et al. |
| 2006/0018344 | A1 | 1/2006 | Pamarti |
| 2006/0126751 | A1 | 6/2006 | Bessios |
| 2006/0159005 | A1 | 7/2006 | Rawlins et al. |
| 2006/0291589 | A1 | 12/2006 | Eliezer et al. |
| 2007/0030796 | A1 | 2/2007 | Green |
| 2007/0164883 | A1 | 7/2007 | Furtner |
| 2007/0263711 | A1 | 11/2007 | Theodor et al. |
| 2008/0104374 | A1 | 5/2008 | Mohamed |
| 2008/0159448 | A1 | 7/2008 | Anim-Appiah et al. |
| 2008/0192621 | A1 | 8/2008 | Suehiro |
| 2008/0316070 | A1 | 12/2008 | Van et al. |
| 2009/0046009 | A1 | 2/2009 | Fujii |
| 2009/0059782 | A1 | 3/2009 | Cole |
| 2009/0154604 | A1 | 6/2009 | Lee et al. |
| 2010/0046644 | A1 | 2/2010 | Mazet |
| 2010/0054355 | A1 | 3/2010 | Kinjo et al. |
| 2010/0081451 | A1 | 4/2010 | Mueck et al. |
| 2010/0215112 | A1 | 8/2010 | Tsai et al. |
| 2010/0215118 | A1 | 8/2010 | Ware et al. |
| 2010/0235673 | A1 | 9/2010 | Abbasfar |
| 2010/0296556 | A1 | 11/2010 | Rave et al. |
| 2010/0309964 | A1 | 12/2010 | Oh et al. |
| 2011/0014865 | A1 | 1/2011 | Seo et al. |
| 2011/0084737 | A1 | 4/2011 | Oh et al. |
| 2011/0127990 | A1 | 6/2011 | Wilson et al. |
| 2011/0235501 | A1 | 9/2011 | Goulahsen |
| 2011/0268225 | A1 | 11/2011 | Cronie et al. |
| 2011/0286497 | A1 | 11/2011 | Nervig |
| 2011/0299555 | A1 | 12/2011 | Cronie et al. |
| 2011/0302478 | A1 | 12/2011 | Cronie et al. |
| 2012/0213299 | A1 | 8/2012 | Cronie et al. |
| 2013/0010892 | A1* | 1/2013 | Cronie .............. H04L 25/0276 375/296 |
| 2013/0013870 | A1 | 1/2013 | Cronie et al. |
| 2013/0114392 | A1 | 5/2013 | Sun et al. |
| 2013/0159584 | A1 | 6/2013 | Nygren et al. |
| 2013/0259113 | A1 | 10/2013 | Kumar |
| 2014/0112376 | A1 | 4/2014 | Wang et al. |
| 2014/0177645 | A1 | 6/2014 | Cronie et al. |
| 2014/0198837 | A1 | 7/2014 | Fox et al. |
| 2014/0226734 | A1* | 8/2014 | Fox .............. H03K 19/017509 375/259 |
| 2014/0254642 | A1 | 9/2014 | Fox et al. |
| 2014/0376604 | A1 | 12/2014 | Verlinden et al. |
| 2015/0063494 | A1 | 3/2015 | Simpson et al. |
| 2015/0078479 | A1 | 3/2015 | Whitby-Strevens |
| 2015/0092532 | A1 | 4/2015 | Shokrollahi et al. |
| 2015/0195005 | A1 | 7/2015 | De Lind Van Wijngaarden et al. |
| 2015/0222458 | A1 | 8/2015 | Hormati et al. |
| 2015/0236885 | A1 | 8/2015 | Ling et al. |
| 2015/0249559 | A1 | 9/2015 | Shokrollahi et al. |
| 2015/0333940 | A1 | 11/2015 | Shokrollahi |
| 2015/0349835 | A1 | 12/2015 | Fox et al. |
| 2015/0365263 | A1 | 12/2015 | Zhang et al. |
| 2015/0380087 | A1 | 12/2015 | Mittelholzer et al. |
| 2015/0381768 | A1 | 12/2015 | Fox et al. |
| 2016/0020824 | A1 | 1/2016 | Ulrich et al. |
| 2016/0036616 | A1 | 2/2016 | Holden et al. |
| 2016/0218894 | A1 | 7/2016 | Fox et al. |
| 2016/0380787 | A1 | 12/2016 | Hormati et al. |
| 2017/0272285 | A1 | 9/2017 | Shokrollahi et al. |
| 2019/0103903 | A1 | 4/2019 | Yang |

FOREIGN PATENT DOCUMENTS

| | | |
|---|---|---|
| EP | 2039221 B1 | 2/2013 |
| JP | 2003163612 A | 6/2003 |
| WO | 2009084121 A1 | 7/2009 |
| WO | 2010031824 A1 | 3/2010 |
| WO | 2011119359 A2 | 9/2011 |
| WO | 2011134678 A1 | 11/2011 |
| WO | 2011151469 A1 | 12/2011 |

OTHER PUBLICATIONS

Anonymous, "Constant-weight code", Wikipedia.org, retrieved on Feb. 6, 2017, (3 pages).

Cheng, Wei-Chung, et al., "Memory Bus Encoding for Low Power: A Tutorial", Proceedings of the IEEE 2001. 2nd International Symposium on Quality Electronic Design, Mar. 28, 2001, 199-204 (6 pages).

Counts, Lew, et al., "One-Chip "Slide Rule" Works with Logs, Antilogs for Real-Time Processing", Analog Devices, Computational Products 6, Reprinted from Electronic Design, May 2, 1985, 3-9 (7 pages).

Dasilva, Victor, et al., "Multicarrier Orthogonal CDMA Signals for Quasi-Synchronous Communication Systems", IEEE Journal on Selected Areas in Communications, vol. 12, No. 5, Jun. 1994, 842-852 (11 pages).

Farzan, Kamran, et al., "Coding Schemes for Chip-to-Chip Interconnect Applications", IEEE Transactions on Very Large Scale Integration (VLSI) Systems, vol. 14, No. 4, Apr. 2006, 393-406 (14 pages).

Giovaneli, Carlos Lopez, et al., "Space-Frequency Coded OFDM System for Multi-Wire Power Line Communications", Power Line Communications and Its Applications, 2005 International Symposium on Vancouver, BC, Canada, IEEE XP-002433844, Apr. 6-8, 2005, 191-195 (5 pages).

Healey, Adam, et al., "A Comparison of 25 Gbps NRZ & PAM-4 Modulation used in Legacy & Premium Backplane Channels", Tyco Electronics Corporation, DesignCon 2012, Jan. 2012, 1-16 (16 pages).

Holden, Brian, "An exploration of the technical feasibility of the major technology options for 400GE backplanes", IEEE 802.3 400GE Study Group, Geneva, CH, Jul. 16, 2013, 1-18 (18 pages).

Holden, Brian, "Simulation results for NRZ, ENRZ & PAM-4 on 16-wire full-sized 400GE backplanes", IEEE 802.3 400GE Study Group, York, UK, Sep. 2, 2013, 1-19 (19 pages).

Holden, Brian, "Using Ensemble NRZ Coding for 400GE Electrical Interfaces", IEEE 802.3 400GE Study Group, May 17, 2013, 1-24 (24 pages).

Jiang, Anxiao, et al., "Rank Modulation for Flash Memories", IEEE Transactions of Information Theory, vol. 55, No. 6, Jun. 2009, 2659-2673 (16 pages).

Oh, Dan, et al., "Pseudo-Differential Vector Signaling for Noise Reduction in Single-Ended Signaling Systems", DesignCon 2009, Rambus Inc., Jan. 2009, (22 pages).

Poulton, John, "Multiwire Differential Signaling", UNC-CH Department of Computer Science Version 1.1, Aug. 6, 2003, 1-20 (20 pages).

(56) References Cited

OTHER PUBLICATIONS

She, James, et al., "A Framework of Cross-Layer Superposition Coded Multicast for Robust IPTV Services over WiMAX", IEEE Wireless Communications and Networking Conference, Apr. 15, 2008, 3139-3144 (6 pages).

Skliar, Osvaldo, et al., "A Method for the Analysis of Signals: the Square-Wave Method", Revista de Matematica: Teoria y Aplicationes, vol. 15, No. 2, Mar. 2008, 109-129 (21 pages).

Slepian, David, "Permutation Modulation", Proceedings of the IEE, vol. 53, No. 3, Mar. 1965, 228-236 (9 pages).

Stan, Mircea, et al., "Bus-Invert Coding for Low-Power I/O", IEEE Transactions on Very Large Scale Integration (VLSI) Systems, vol. 3, No. 1, Mar. 1995, 49-58 (10 pages).

Tallini, Luca, et al., "Transmission Time Analysis for the Parallel Asynchronous Communication Scheme", IEEE Transactions on Computers, vol. 52, No. 5,, May 2003, 558-571 (14 pages).

Wang, Xin, et al., "Applying CDMA Technique to Network-on-Chip", IEEE Transactions on Very Large Scale Integration (VLSI) Systems, vol. 15, No. 10, Oct. 1, 2007, 1091-1100 (10 pages).

\* cited by examiner

8b9w

ORTHOGONAL DIFFERENTIAL VECTOR SIGNALING CODES WITH EMBEDDED CLOCK

CROSS-REFERENCE TO RELATED APPLICATIONS

This application is a continuation of U.S. application Ser. No. 15/829,904, filed Dec. 2, 2017, entitled "Orthogonal Differential Vector Signaling Codes with Embedded Clock", which is a continuation of U.S. application Ser. No. 15/285,316, filed Oct. 4, 2016, entitled "Orthogonal Differential Vector Signaling Codes with Embedded Clock", which is a continuation of U.S. application Ser. No. 14/816,896, filed Aug. 3, 2015, entitled "Orthogonal Differential Vector Signaling Codes with Embedded Clock," which claims priority to U.S. Provisional Patent Application 62/032,175, filed Aug. 1, 2014, entitled "Orthogonal Differential Vector Signaling Codes with Embedded Clock," all of which are hereby incorporated herein by reference in their entirety for all purposes.

REFERENCES

The following references are herein incorporated by reference in their entirety for all purposes:

U.S. Patent Publication No. 2011/0268225 of U.S. patent application Ser. No. 12/784,414, filed May 20, 2010, naming Harm Cronie and Amin Shokrollahi, entitled "Orthogonal Differential Vector Signaling", hereinafter identified as [Cronie I];

U.S. patent application Ser. No. 13/030,027, filed Feb. 17, 2011, naming Harm Cronie, Amin Shokrollahi and Armin Tajalli, entitled "Methods and Systems for Noise Resilient, Pin-Efficient and Low Power Communications with Sparse Signaling Codes", hereinafter identified as [Cronie II];

U.S. patent application Ser. No. 14/158,452, filed Jan. 17, 2014, naming John Fox, Brian Holden, Peter Hunt, John D Keay, Amin Shokrollahi, Richard Simpson, Anant Singh, Andrew Kevin John Stewart, and Giuseppe Surace, entitled "Chip-to-Chip Communication with Reduced SSO Noise", hereinafter identified as [Fox I];

U.S. patent application Ser. No. 13/842,740, filed Mar. 15, 2013, naming Brian Holden, Amin Shokrollahi and Anant Singh, entitled "Methods and Systems for Skew Tolerance in and Advanced Detectors for Vector Signaling Codes for Chip-to-Chip Communication", hereinafter identified as [Holden I];

U.S. Provisional Patent Application No. 61/934,804, filed Feb. 2, 2014, naming Ali Hormati and Amin Shokrollahi, entitled "Methods for Code Evaluation Using ISI Ratio", hereinafter identified as [Hormati I];

U.S. Provisional Patent Application No. 61/934,807, filed Feb. 2, 2014, naming Amin Shokrollahi, entitled "Vector Signaling Codes with High pin-efficiency and their Application to Chip-to-Chip Communications and Storage", hereinafter identified as [Shokrollahi I];

U.S. Provisional Patent Application No. 61/839,360, filed Jun. 23, 2013, naming Amin Shokrollahi, entitled "Vector Signaling Codes with Reduced Receiver Complexity", hereinafter identified as [Shokrollahi II].

U.S. Provisional Patent Application No. 61/946,574, filed Feb. 28, 2014, naming Amin Shokrollahi, Brian Holden, and Richard Simpson, entitled "Clock Embedded Vector Signaling Codes", hereinafter identified as [Shokrollahi III].

U.S. Provisional Patent Application No. 62/015,172, filed Jul. 10, 2014, naming Amin Shokrollahi and Roger Ulrich, entitled "Vector Signaling Codes with Increased Signal to Noise Characteristics", hereinafter identified as [Shokrollahi IV].

U.S. patent application Ser. No. 13/895,206, filed May 15, 2013, naming Roger Ulrich and Peter Hunt, entitled "Circuits for Efficient Detection of Vector Signaling Codes for Chip-to-Chip Communications using Sums of Differences", hereinafter identified as [Ulrich I].

U.S. Provisional Patent Application No. 62/026,860, filed Jul. 21, 2014, naming Roger Ulrich and Amin Shokrollahi, entitled "Bus Reversible Orthogonal Differential Vector Signaling Codes", hereinafter identified as [Ulrich II].

The following additional references to prior art have been cited in this application:

U.S. Pat. No. 7,053,802, filed Apr. 22, 2004 and issued May 30, 2006, naming William Cornelius, entitled "Single-Ended Balance-Coded Interface with Embedded-Timing", hereinafter identified as [Cornelius];

U.S. Pat. No. 8,064,535, filed Mar. 2, 2007 and issued Nov. 22, 2011, naming George Wiley, entitled "Three Phase and Polarity Encoded Serial Interface, hereinafter identified as [Wiley].

U.S. Pat. No. 8,649,460, filed Mar. 11, 2010 and issued Feb. 11, 2014, naming Frederick Ware and Jade Kizer, entitled "Techniques for Multi-Wire Encoding with an Embedded Clock", hereinafter identified as [Ware].

BACKGROUND

In communication systems, a goal is to transport information from one physical location to another. It is typically desirable that the transport of this information is reliable, is fast and consumes a minimal amount of resources. One common information transfer medium is the serial communications link, which may be based on a single wire circuit relative to ground or other common reference, or multiple such circuits relative to ground or other common reference. A common example uses singled-ended signaling ("SES"). SES operates by sending a signal on one wire, and measuring the signal relative to a fixed reference at the receiver. A serial communication link may also be based on multiple circuits used in relation to each other. A common example of the latter uses differential signaling ("DS"). Differential signaling operates by sending a signal on one wire and the opposite of that signal on a matching wire. The signal information is represented by the difference between the wires, rather than their absolute values relative to ground or other fixed reference.

There are a number of signaling methods that maintain the desirable properties of DS while increasing pin efficiency over DS. Vector signaling is a method of signaling. With vector signaling, a plurality of signals on a plurality of wires is considered collectively although each of the plurality of signals might be independent. Each of the collective signals is referred to as a component and the number of plurality of wires is referred to as the "dimension" of the vector. In some embodiments, the signal on one wire is entirely dependent on the signal on another wire, as is the case with DS pairs, so in some cases the dimension of the vector might refer to the number of degrees of freedom of signals on the plurality of wires instead of exactly the number of wires in the plurality of wires.

Any suitable subset of a vector signaling code denotes a "sub code" of that code. Such a subcode may itself be a vector signaling code. With binary vector signaling, each component or "symbol" of the vector takes on one of two possible values. With non-binary vector signaling, each symbol has a value that is a selection from a set of more than two possible values. When transmitted as physical signals on a communications medium, symbols may be represented by particular physical values appropriate to that medium; as examples, in one embodiment a voltage of 150 mV may represent a "+1" symbol and a voltage of 50 mV may represent a "−1" symbol, while in another embodiment "+1" may be represented by 800 mV and "−1" as −800 mV.

A vector signaling code, as described herein, is a collection C of vectors of the same length N, called codewords. The ratio between the binary logarithm of the size of C and the length N is called the pin-efficiency of the vector signaling code. The Orthogonal Differential Vector Signaling codes of [Cronie I], [Cronie II], [Fox I], [Shokrollahi I], [Shokrollahi II], and [Shokrollahi III] are examples of vector signaling codes, and are used herein for descriptive purposes.

FIG. 1 illustrates a communication system employing vector signaling codes. Bits S0, S1, S2 enter block-wise 100 into an encoder 105. The size of the block may vary and depends on the parameters of the vector signaling code. The encoder generates a codeword of the vector signaling code for which the system is designed. In operation, the encoder may generate information used to control PMOS and NMOS transistors within driver 110, generating voltages or currents on the N communication wires 125 comprising the communications channel 120. Receiver 132 reads the signals on the wires, possibly including amplification, frequency compensation, and common mode signal cancellation. Receiver 132 provides its results to decoder 138, which recreates the input bits at 140, here shown as received bits R0, R1, R2.

Depending on which vector signaling code is used, there may be no decoder, or no encoder, or neither a decoder nor an encoder. For example, for the 8b8w code disclosed in [Cronie II], both encoder 112 and decoder 1138 exist. On the other hand, for the Hadamard code disclosed in [Cronie I], an explicit decoder may be unnecessary, as the system may be configured such that receiver 132 generates output bits 140 directly.

The operation of the transmitting device 110, comprising input data 100 and elements 112 and 118, and that of the receiving device 130, including element 132, optional element 138, and output data 140, have to be completely synchronized in order to guarantee correct functioning of the communication system. In some embodiments, this synchronization is performed by an external clock shared between the transmitter and the receiver. Other embodiments may combine the clock function with one or more of the data channels, as in the well-known Biphase encoding used for serial communications.

One important example is provided by memory interfaces in which a clock is generated on the controller and shared with the memory device. The memory device may use the clock information for its internal memory operations, as well as for I/O. Because of the burstiness and the asynchronicity of memory operations, the I/O may not be active all the time. Moreover, the main clock and the data lines may not be aligned due to skew. In such cases, additional strobe signals are used to indicate when to read and write the data.

BRIEF DESCRIPTION

Orthogonal differential vector signaling codes providing transport for both data and a clocking signal are described which are suitable for implementation in both conventional high-speed CMOS and DRAM integrated circuit processes. Example channels derived from current practice for Low-Powered DDR4 interfaces are described, as are modest channel enhancements providing higher speed and greater signal integrity.

DETAILED DESCRIPTION

Figure 1:
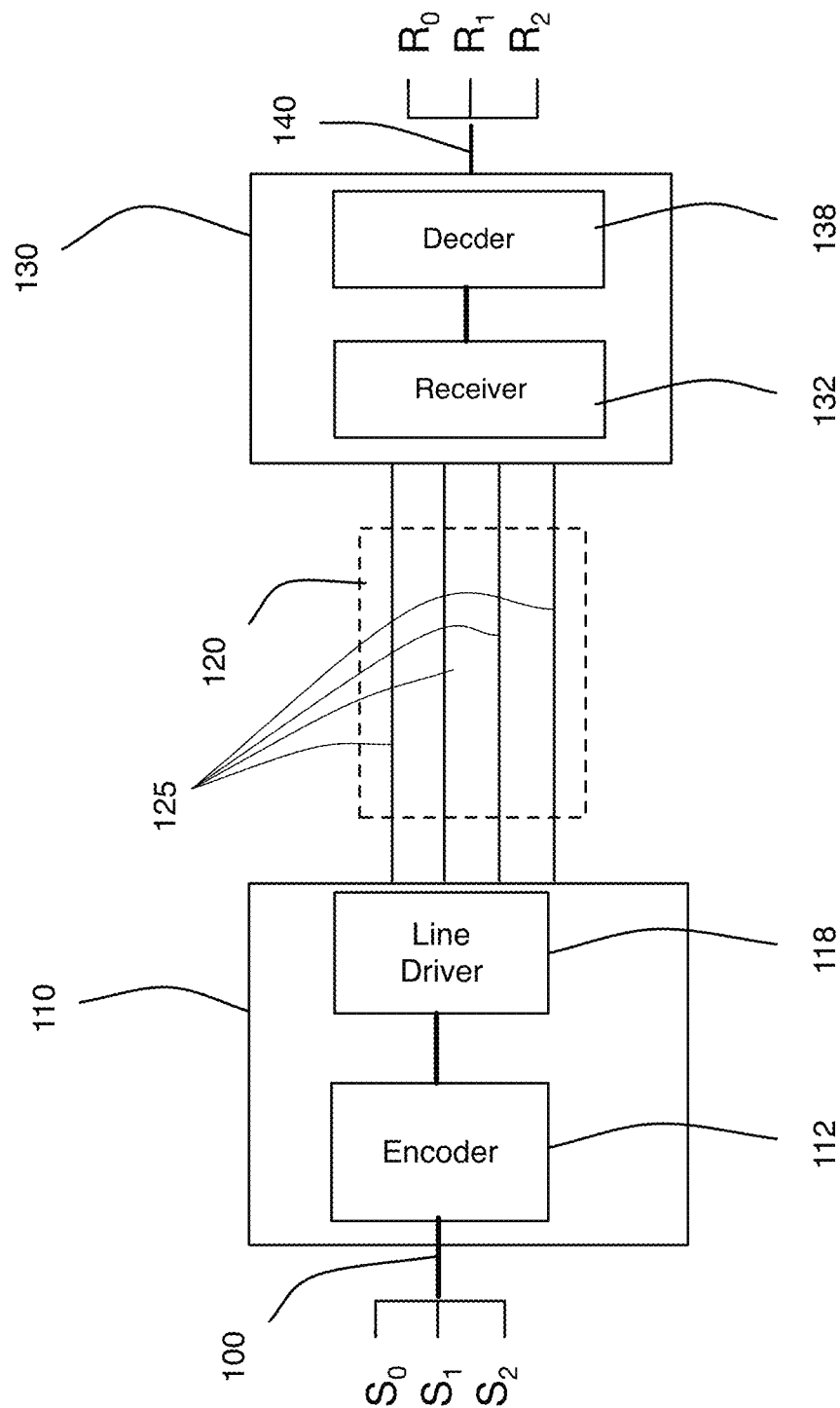
FIG. 1 illustrates a communication system employing vector signaling codes.

FIG. 1 illustrates a communication system employing vector signaling codes. Source data to transmitter 110, herein illustrated as S0, S1, S2 enter block-wise 100 into encoder 112. The size of the block may vary and depends on the parameters of the vector signaling code. The encoder 112 generates a codeword of the vector signaling code for which the system is designed. In operation, the codeword produced by encoder 112 is used to control PMOS and NMOS transistors within driver 118, generating two, three, or more distinct voltages or currents on each of the N communication wires 125 of communications channel 120, to represent the N symbols of the codeword. Within communications receiver 130, receiver 132 reads the voltages or currents on the N wires 125, possibly including amplification, frequency compensation, and common mode signal cancellation, providing its results to decoder 138, which recreates the input bits as received results 140, herein shown as R0, R1, R2. As will be readily apparent, different codes may be associated with different block sizes and different codeword sizes; for descriptive convenience and without implying limitation, the example of FIG. 1 illustrates a system using an ODVS code capable of encoding a three binary bit value for transmission over four wires, a so-called 3b4w code.

Depending on which vector signaling code is used, there may be no decoder, or no encoder, or neither a decoder nor an encoder. For example, for the 8b8w code disclosed in [Cronie II], both encoder 112 and decoder 138 exist. On the other hand, for the H4 code disclosed in [Cronie I] (also described herein as ENRZ,) an explicit decoder may be unnecessary, as the system may be configured such that receiver 132 generates the received results 140 directly.

The operation of the communications transmitter 110 and communications receiver 130 have to be completely synchronized in order to guarantee correct functioning of the communication system. In some embodiments, this synchronization is performed by an external clock shared between the transmitter and the receiver. Other embodiments may combine the clock function with one or more of the data channels, as in the well-known Biphase encoding used for serial communications.

One important example is provided by memory interfaces in which a clock is generated on the controller and shared with the memory device. The memory device may use the clock information for its internal memory operations, as well as for I/O. Because of the burstiness and the asynchronicity of memory operations, the I/O may not be active all the time. Moreover, the main clock and the data lines may not be aligned due to skew. In such cases, additional strobe signals are used to indicate when to read and write the data.

The interface between a system memory controller and multiple Dynamic RAM devices has been well optimized over multiple design generations for both transfer speed and low power consumption. The present state of the art DRAM interface, LPDDR4, includes 8 data lines, 1 DMI signal, 2 strobe lines, as well as other non-data-transfer related lines.

There is considerable interest in extending LPDDR4 to support higher performance at equal or less power consumption, but simple performance extrapolations of the existing technology seem problematic. Decreasing signal integrity precludes simply raising data transfer rates using the existing single-ended interconnection, and misalignment of received DRAM data and its strobe signal is a known issue even at current clock speeds. However, introduction of new technology is constrained by a strong desire to retain as much of the conventional practice as possible regarding bus layout, signal distribution, clocking, etc., as well as a hard requirement that the new technology be implementable in both the high-speed CMOS process used for memory controllers, and in the highly specialized DRAM fabrication process which produces extremely small, high capacitance and low leakage memory cells, but comparatively slow digital and interface logic.

Because of this slow logic speed, conventional DRAM designs utilize two or more phases of processing logic to handle the current LPDDR4 data transfer rates, as one example using one phase of processing logic to capture data on the rising edge of the data transfer strobe, and another phase of processing logic to capture data on the falling edge of the strobe. One hidden limitation of such multi-phased processing embodiments is the difficulty of extracting difference-based information from consecutively received unit intervals, as consecutive unit intervals by definition are known only by different processing phases. Thus, multi-phased processing is problematic for both codes using transition-encoding, as well as embedded- or self-clocking data solutions that rely on comparison of data values received in consecutive unit intervals.

These issues of clock extraction, and transition- or change-detection are most intractable in the communications receiver embodiment, thus the examples herein focus on embodiments in which the relatively slow DRAM device is the receiver. No limitation is implied, as one familiar with the art will readily acknowledge that bidirectional data communication with DRAM devices is well understood, and that any example embodiment suitable for DRAM receive implementation could easily implement the simpler transmit requirements as well.

Receivers Using Multi-Input Comparators

As described in [Holden I], a multi-input comparator with coefficients $a_0, a_1, \ldots, a_{m-1}$ is a circuit that accepts as its input a vector $(x_0, x_1, \ldots, x_{m-1})$ and outputs $$\text{Result} = (a_0 * x_0 + \ldots + a_{m-1} * x_{m-1}) \quad \text{(Eqn. 1)}$$

In many embodiments, the desired output is a binary value, thus the value Result is sliced with an analog comparator to produce a binary decision output. Because this is a common use, the colloquial name of this circuit incorporates the term "comparator", although other embodiments may use a PAM-3 or PAM-4 slicer to obtain ternary or quaternary outputs, or indeed may retain the analog output of Eqn. 1 for further computation. In at least one embodiment, the coefficients are selected according to sub-channel vectors corresponding to rows of a non-simple orthogonal or unitary matrix used to generate the ODVS code.

As one example, [Ulrich I] teaches that the ODVS code herein called ENRZ may be detected using three instances of the same four input multi-input comparator, performing the operations $$R_0 = (A+C) - (B+D) \quad \text{(Eqn. 2)}$$

$$R_1 = (C+D) - (A+B) \quad \text{(Eqn. 3)}$$

$$R_2 = (C\ B) - (D+A) \quad \text{(Eqn. 4)}$$

which may be readily performed with three identical instances of a multi-input comparator with coefficients of [+1 +1 −1 −1] and distinct permutations of the four input values as described in Eqn. 2-4.

ODVS Sub-Channels

It is conventional to consider the data input to encoder 112 of FIG. 1 as vectors of data (i.e., a data word) to be atomically encoded as a codeword to be transmitted across channel 120, detected by receiver 132, and ultimately decoded 138 to produce a received reconstruction of the transmitted vector or data word.

Figure 2:
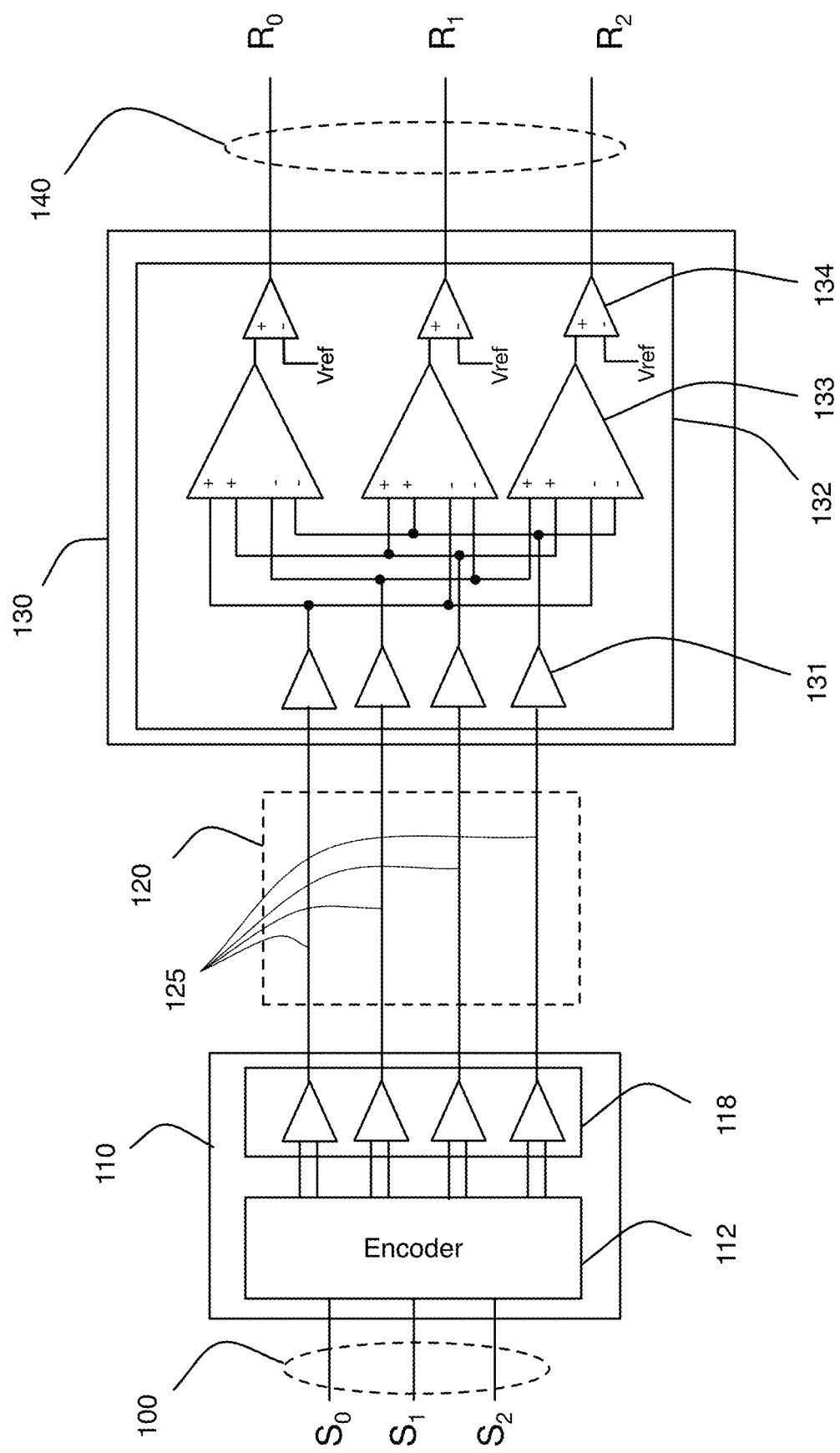
FIG. 2 illustrates one embodiment of an ODVS communications system in which a discrete decoding function is not required.

However, it is equally accurate to model the communications system in a somewhat different way. As this alternate model is most easily understood in a system not requiring a separate decoder, a particular embodiment based on the ENRZ code as illustrated in FIG. 2 will be used for purposes of description, with no limitation being implied. Elements in FIG. 2 functionally identical to elements of FIG. 1 are identically numbered, although FIG. 2 may subsequently illustrate additional internal structure or composition of features that are generically described in FIG. 1

In FIG. 2, input data vector 100 entering communications transmitter 110 is explicitly shown to be expanded to its individual bits $S_0$, $S_1$, $S_2$ and entering encoder 112. Individual signals representing the symbols of the codeword output by encoder 112 are shown controlling individual line drivers 118 to emit signals onto wires 125 comprising communications channel 120. As any one wire transporting the ENRZ code can take on one of four different signal values, two control signals are shown controlling each wire's line driver.

As previously noted, in this embodiment communications receiver 130 does not require an explicit decoder. The internal structure of receiver 132 is illustrated, comprising four receive front ends (as 131) that accept signals from wires 125, and optionally may include amplification and equalization, as required by the characteristics of the communications channel 120. Three multi-input comparators are shown with their inputs connected to the four received wire signals as described by Eqns. 2, 3, and 4. For avoidance of confusion, the multi-input comparators are illustrated as including a computational function 133 followed by a slicing function 134 producing digital outputs $R_0$, $R_1$, $R_2$ from the computational combination of the input values.

One familiar with the art may note that the ODVS encoder accepts one set of input data and outputs one codeword per transmit unit interval. If, as is the case in many embodiments, the encoder includes combinatorial digital logic (i.e. without additional internal state,) this periodic codeword output may easily be seen as performing a sampling function on the input data followed by the encoding transformation, subsequent transmission, etc. Similarly, if the detection operation within the receiver is similarly combinatorial, as is the case here with multi-input comparators performing the detection, the state of a given output element is solely determined by the received signal levels on some number of channel wires. Thus, each independent signal input (as one example, $S_0$) and its equivalent independent signal output (as $R_0$) may be considered a virtual communications channel, herein called a "sub-channel" of the ODVS encoded system. A given sub-channel may be binary (i.e. communicate a two-state value) or may represent a higher-ordered value. Indeed, as taught by [Shokrollahi IV], the sub-channels of a given ODVS code are sufficiently independent that they may utilize different alphabets (and sizes of alphabets) to describe the values they communicate.

All data communications in an ODVS system, including the state changes in sub-channels, are communicated as codewords over the entire channel. An embodiment may associate particular mappings of input values to codewords and correlate those mappings with particular detector results, as taught by [Holden I] and [Ulrich I], but those correlations should not be confused with partitions, subdivisions, or sub-channels of the communications medium itself The concept of ODVS sub-channels is not limited by the example embodiment to a particular ODVS code, transmitter embodiment, or receiver embodiment. Encoders and/or decoders maintaining internal state may also be components of embodiments. Sub-channels may be represented by individual signals, or by states communicated by multiple signals.

Timing Information on a Sub-Channel

As an ODVS communications system must communicate each combination of data inputs as encoded transmissions, and the rate of such encoded transmissions is of necessity constrained by the capacity of the communications medium, the rate of change of the data to be transmitted must be within the Nyquist limit, where the rate of transmission of codewords represents the sampling interval. As one example, a binary clock or strobe signal may be transmitted on an ODVS sub-channel, if it has no more than one clock edge per codeword transmission.

An embodiment of an ODVS encoder and its associated line drivers may operate asynchronously, responding to any changes in data inputs. Other embodiments utilize internal timing clocks to, as one example, combine multiple phases of data processing to produce a single high-speed output stream. In such embodiments, output of all elements of a codeword is inherently simultaneous, thus a strobe or clock signal being transported on a sub-channel of the code will be seen at the receiver as a data-aligned clock (e.g. with its transition edges occurring simultaneous to data edges on other sub-channels of the same code.) Similar timing relationships are often presumed in clock-less or asynchronous embodiments as well.

Figure 3:
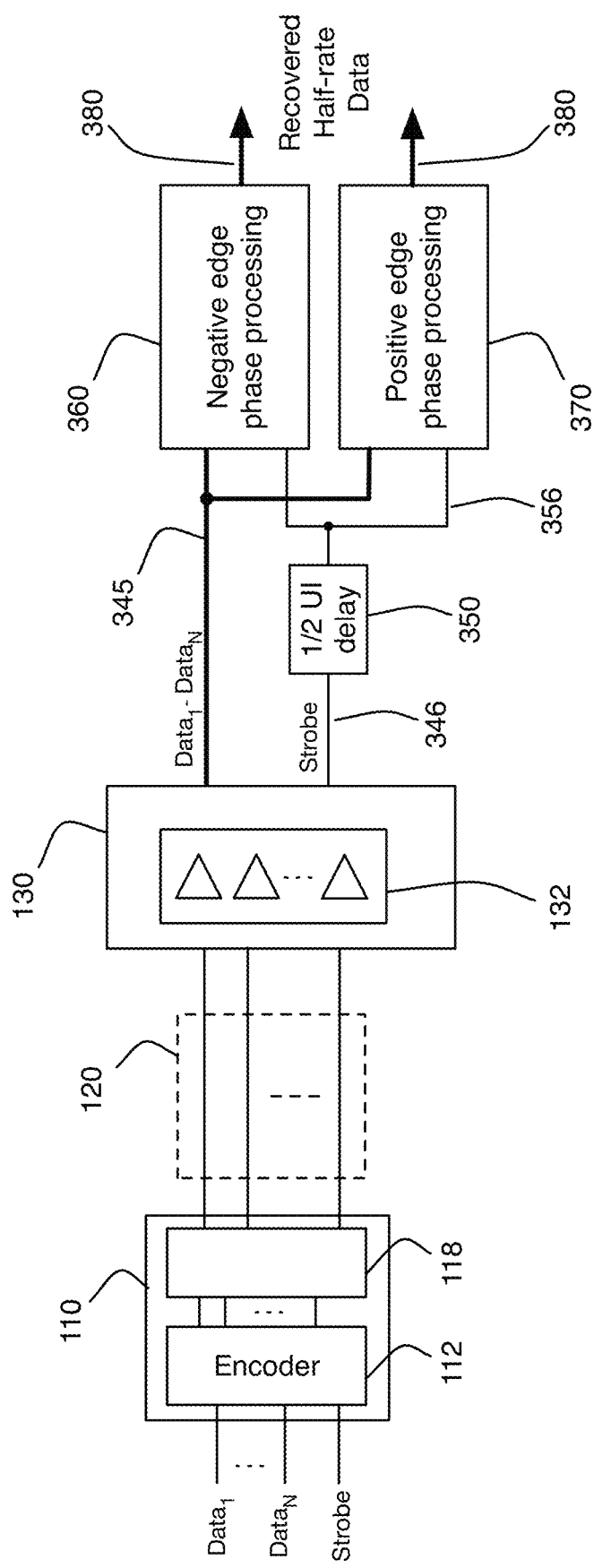
FIG. 3 is a block diagram of an embodiment transporting data and a clock signal using ODVS code, and incorporating elements facilitating integration of the receiver with conventional DRAM practice.

FIG. 3 is a block diagram of an ODVS communications system, in which a data-aligned strobe signal (comparable to the strobe associated with known LPDDR4 channels) is carried by a sub-channel, and N bits of data are carried on other sub-channels of the same code. At the receiver, a collection of multi-input comparators 132 detects the received information, outputting data 345 and a received data-aligned strobe 346. Introduction of a one-half unit interval time delay 350 offsets the received strobe to produce an eye-aligned strobe 356 having a transition edge at the optimum sampling time to latch data 345. As is conventional in many DRAM embodiments, two processing phases are shown for data sampling; phase 360 sampling data 345 on the negative edge of eye-aligned strobe 356, and phase 370 sampling data 345 on the positive edge of eye-aligned strobe 356. Methods of embodiment for delay 350 as well as any associated adjustment or calibration means it may require is well known in the art for LPDDR interfaces.

Mapping LPDDR Communications to an ODVS System

The existing LPDDR4 specification provides for eight data wires, one wire for DMI, and two Strobe wires, for a total of 11 wires. These legacy connections may be mapped to a new protocol mode, herein called LPDDR5, using ODVS encoding in several ways.

As taught by [Holden I], the noise characteristics of a multi-input comparator are dependent on its input size and configuration. [Shokrollahi IV] also teaches that the signal amplitudes resulting from various computations as Eqn. 1 can present different receive eye characteristics. Thus, preferred embodiments will designate a higher quality (e.g. wider eye opening) sub-channel to carry clock, strobe, or other timing information, when the characteristics of the available sub-channels vary.

Glasswing

Figure 4:
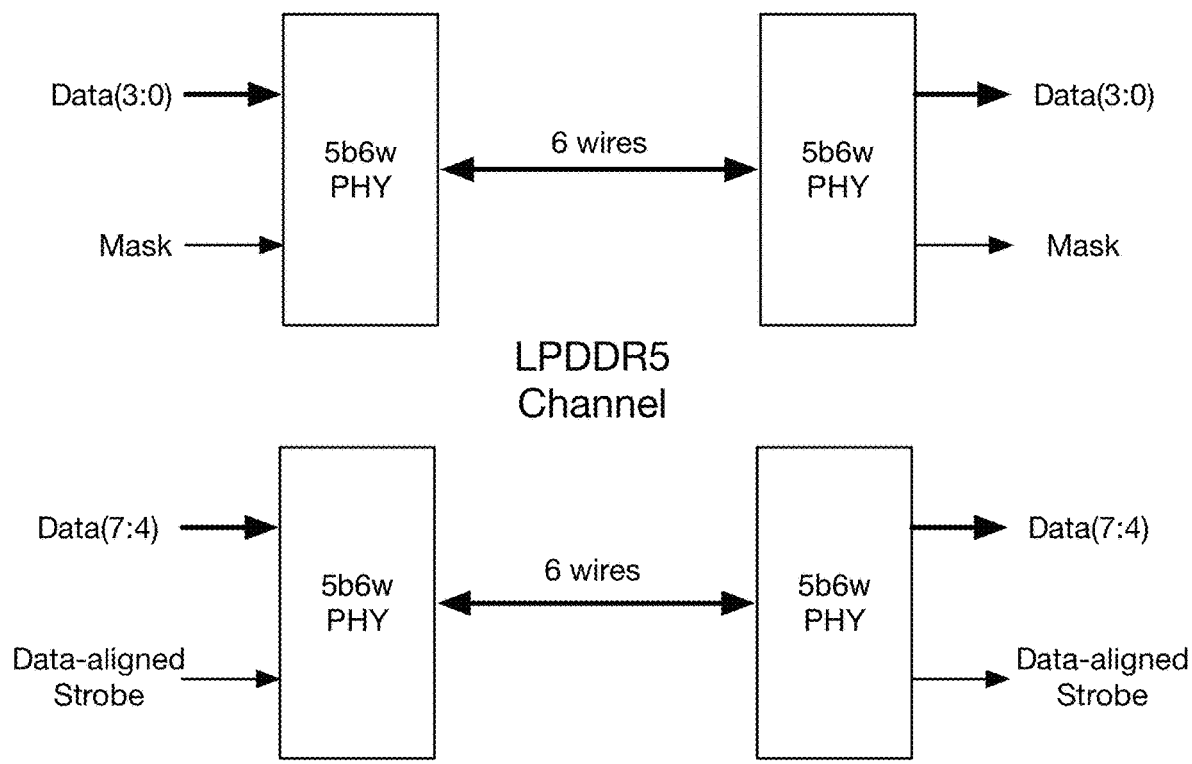
FIG. 4 is a block diagram of an embodiment utilizing 5b6w code, also known as Glasswing, to implement transport over a proposed LPDDR5 channel.

A first embodiment, herein identified as Glasswing and shown in the block diagram of FIG. 4, adds a new wire to provide a total of 12 wires that are then logically divided into two groups of six wires each. Each group of six wires is used to carry an instance of an ODVS code transmitting 5 bits on 6 wires (called the 5b6w code henceforth), thus providing a total of ten sub-channels. Eight sub-channels are used to carry eight bits of data, one sub-channel is used to carry a mask bit (conventionally used during DRAM write operations to block individual byte writes), and one sub-channel is used to carry a data-aligned strobe. The 5b6w code is balanced, all symbols within any given codeword summing to zero, and is structured such that each codeword contains exactly one +1 and one −1, the remaining codeword symbols being including +⅓ and −⅓ symbols. As will be apparent to one familiar with the art, multiple permutations of a suitable codeword set and corresponding comparator detection coefficients may be used in embodiments.

Each 5b6w receiver in Glasswing incorporates five multi-input comparators. In a preferred embodiment, the codewords of each instance of the 5b6w code are shown in Table 1 and the set of comparators are:

$x0-x1$ $(x0+x1)/2-x2$ $x4-x5$ $x3-(x4+x5)/2$ $(x0+x1+x2)/3-(x3+x4+x5)/3$ where the wires of each six wire group are designated as x0, x1 . . . x5.

TABLE 1

| | |
|---|---|
| ±[1, ⅓, −⅓, −1, −⅓, ⅓] | ±[1, ⅓, −⅓, ⅓, −1, −⅓] |
| ±[⅓, 1, −⅓, −1, −⅓, ⅓] | ±[⅓, 1, −⅓, ⅓, −1, −⅓] |

TABLE 1-continued

±[⅓, -⅓, 1, -1, -⅓, ⅓]    ±[⅓, -⅓, 1, ⅓, -1, -⅓]
±[-⅓, ⅓, 1, -1, -⅓, ⅓]    ±[-⅓, ⅓, 1, ⅓, -1, -⅓]
±[1, ⅓, -⅓, -1, ⅓, -⅓]    ±[1, ⅓, -⅓, ⅓, -⅓, -1]
±[⅓, 1, -⅓, -1, ⅓, -⅓]    ±[⅓, 1, -⅓, ⅓, -⅓, -1]
±[⅓, -⅓, 1, -1, ⅓, -⅓]    ±[⅓, -⅓, 1, ⅓, -⅓, -1]
±[-⅓, ⅓, 1, -1, ⅓, -⅓]    ±[-⅓, ⅓, 1, ⅓, -⅓, -1]

Additional information about this 5b6w code is provided in [Ulrich II].

8b9w

Figure 5:
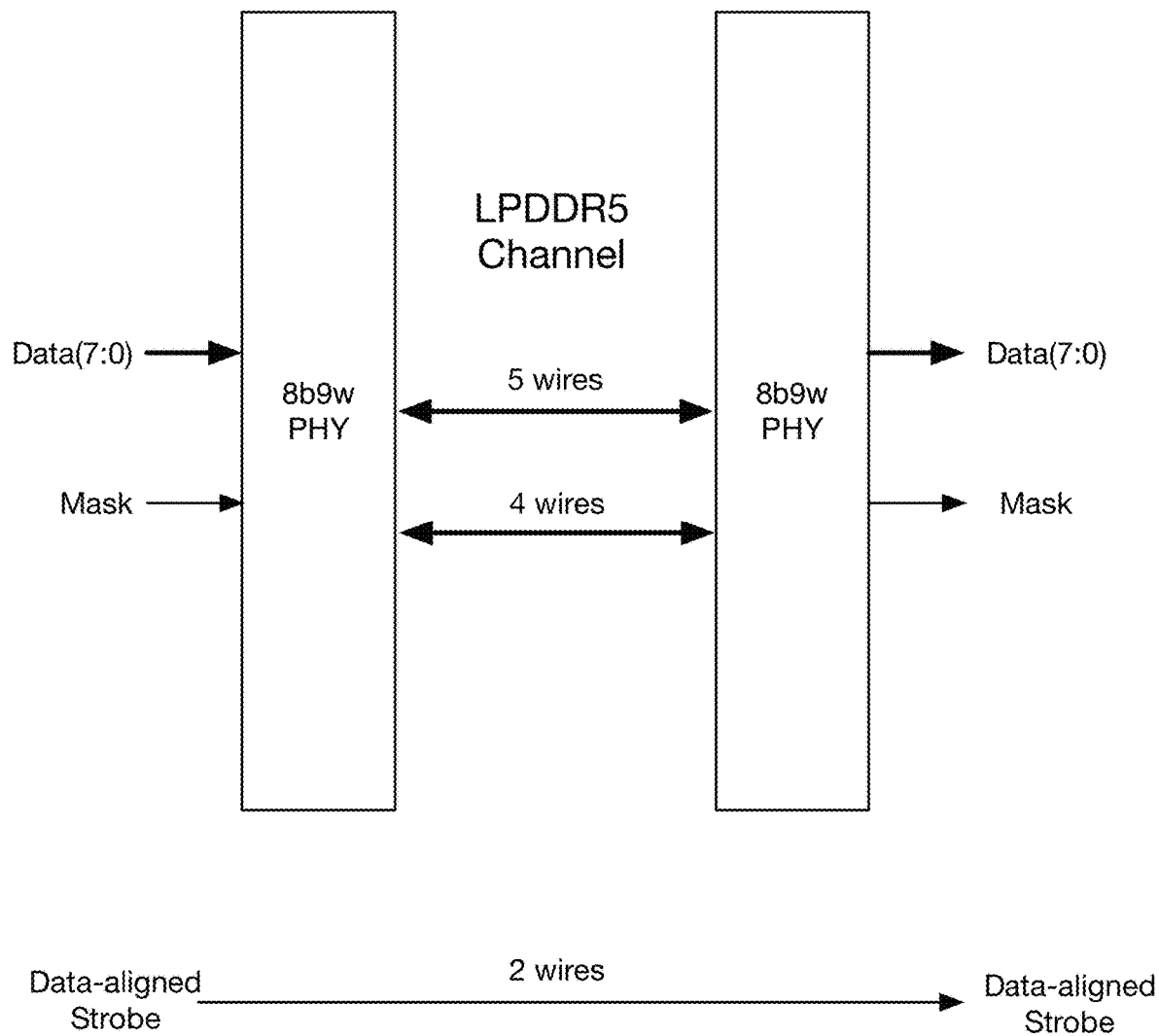
FIG. 5 is a block diagram of an embodiment utilizing 8b9w code to implement transport over a proposed LPDDR5 channel.

A second embodiment, herein identified as "8b9w" and shown in the block diagram of FIG. 5, retains the existing LPDDR4 compliment of 11 data transfer wires. Nine wires are used to carry an 8b9w code internally including a 5 wire code herein called the 4.5b5w code and a 4 wire code herein called the 3.5b4w code, which combined provides 288 distinct codeword combinations of which 257 will be used by the encoder. 256 of the codewords are used to encode 8 bits of data when the Mask input is false, and one codeword is used to mark a "do not write" condition when the Mask input is true. A data-aligned strobe is communicated using legacy means, using the two existing LPDDR4 strobe wires.

In at least one embodiment, each 4.5b5w receiver incorporates seven multi-input comparators, using the codewords of the 4.5b5w code as given in Table 2 and the set of comparators $x0-x1$ $x0-x2$ $x0-x3$ $x1-x2$ $x1-x3$ $x2-x3$ $(x0+x1+x2+x3)/4-x4$ where the wires of each five wire group are designated as x0, x1 . . . x4.

TABLE 2

±[0, -1, 1, 1, -1]    ±[-1, 1, 0, 1, -1]
±[0, 1, -1, 1, -1]    ±[1, -1, 0, 1, -1]
±[0, 1, 1, -1, -1]    ±[1, 1, 0, -1, -1]
±[-1, 0, 1, 1, -1]    ±[-1, 1, 1, 0, -1]
±[1, 0, -1, 1, -1]    ±[1, -1, 1, 0, -1]
±[1, 0, 1, -1, -1]    ±[1, 1, -1, 0, -1]

The ISI-ratio of the first 6 comparators (as defined in [Hormati I]) is 2, whereas the ISI-ratio of the last comparator is 1.

In the same embodiments, the codewords of the 3.5b4w code are given in Table 3.

TABLE 3

±[1, -1, 0, 0]    ±[0, 1, -1, 0]
±[1, 0, -1, 0]    ±[0, 1, 0, -1]
±[1, 0, 0, -1]    ±[0, 0, 1, -1]

Each 3.5b4w receiver incorporates six multi-input comparators. If the wires of each four wire group are designated as x0, x1 . . . x3, the comparators are:

$x0-x1$ $x0-x2$ $x0-x3$ $x1-x2$ $x1-x3$ $x2-x3$

The ISI-ratio of all these comparators (as defined in [Hormati I]) is 2.

ENRZ

Figure 6:
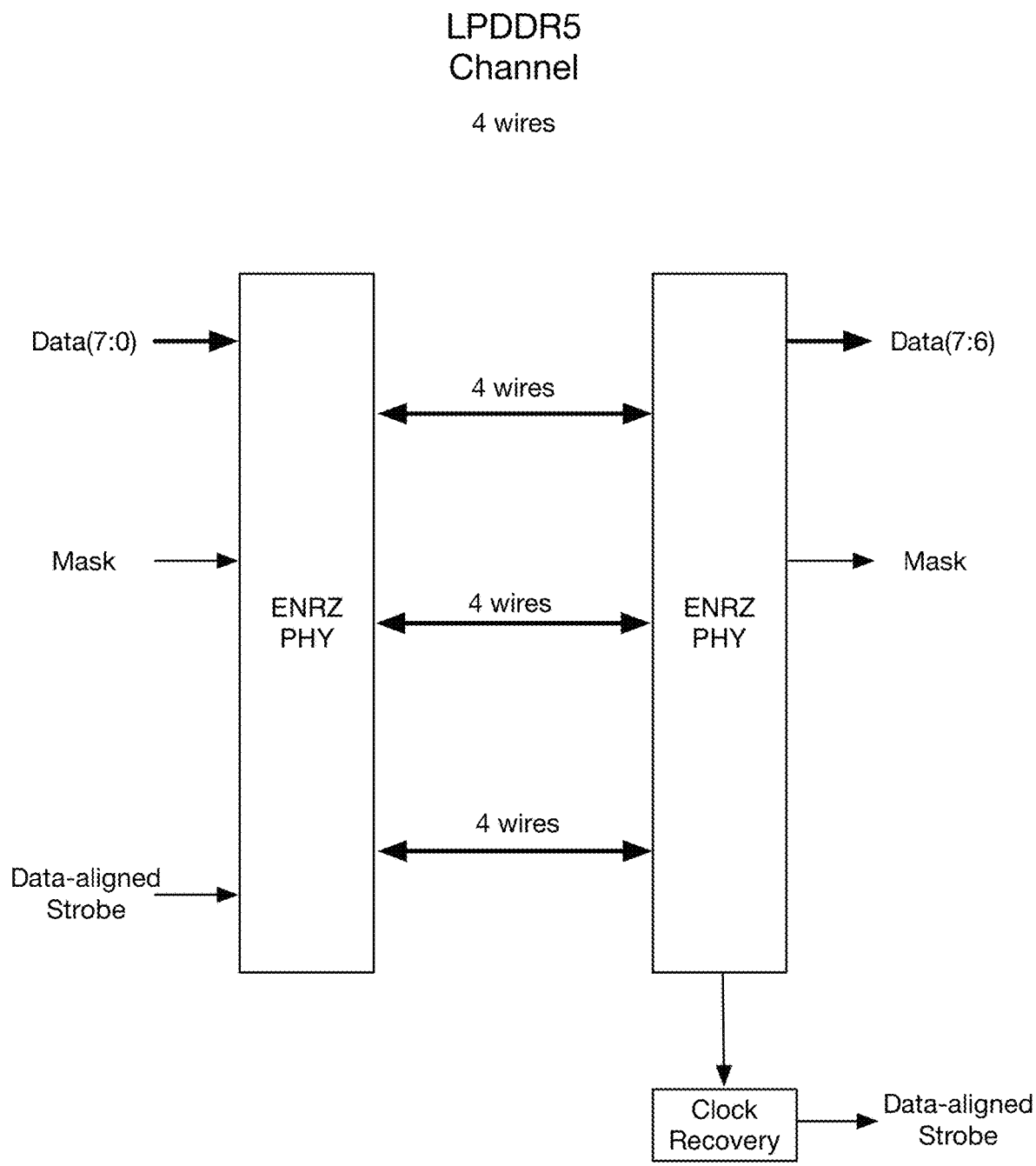
FIG. 6 is a block diagram of an embodiment utilizing ENRZ code to implement transport over a proposed LPDDR5 channel.

A third embodiment, herein identified as "ENRZ" and shown in the block diagram of FIG. 6, adds a new wire to the existing LPDDR4 compliment to provide a total of 12 wires that are then logically divided into three groups of four wires each. Each group of four wires is used to carry an instance of ENRZ code, each instance thus having eight unique codewords. In at least one embodiment, one codeword from each instance is reserved as a repeat code, with the seven remaining codewords per instance being combined by the encoder to provide 7*7*7=343 unique combinations, more than sufficient to encode eight data bits and a mask condition, as in the previous example. In another embodiment, there is no designated repeat codeword. Instead, the transmitter may store the last transmitted codeword, and produce for the following UI a codeword that is different from the transmitted one, as taught in [Shokrollahi III]. The Data-aligned strobe is used to clock codeword emission at the transmitter, with the repeat code being emitted on each instance whenever the present codeword to be emitted is identical to the codeword emitted in the previous unit interval. At the receiver, a known art clock recover circuit extracts timing information from received codeword edges, and a one data value history buffer regenerates duplicated data values for each instance on detection of a received repeat codeword.

Further description of this embodiment may be found in [Shokrollahi III].

Figure 7A:
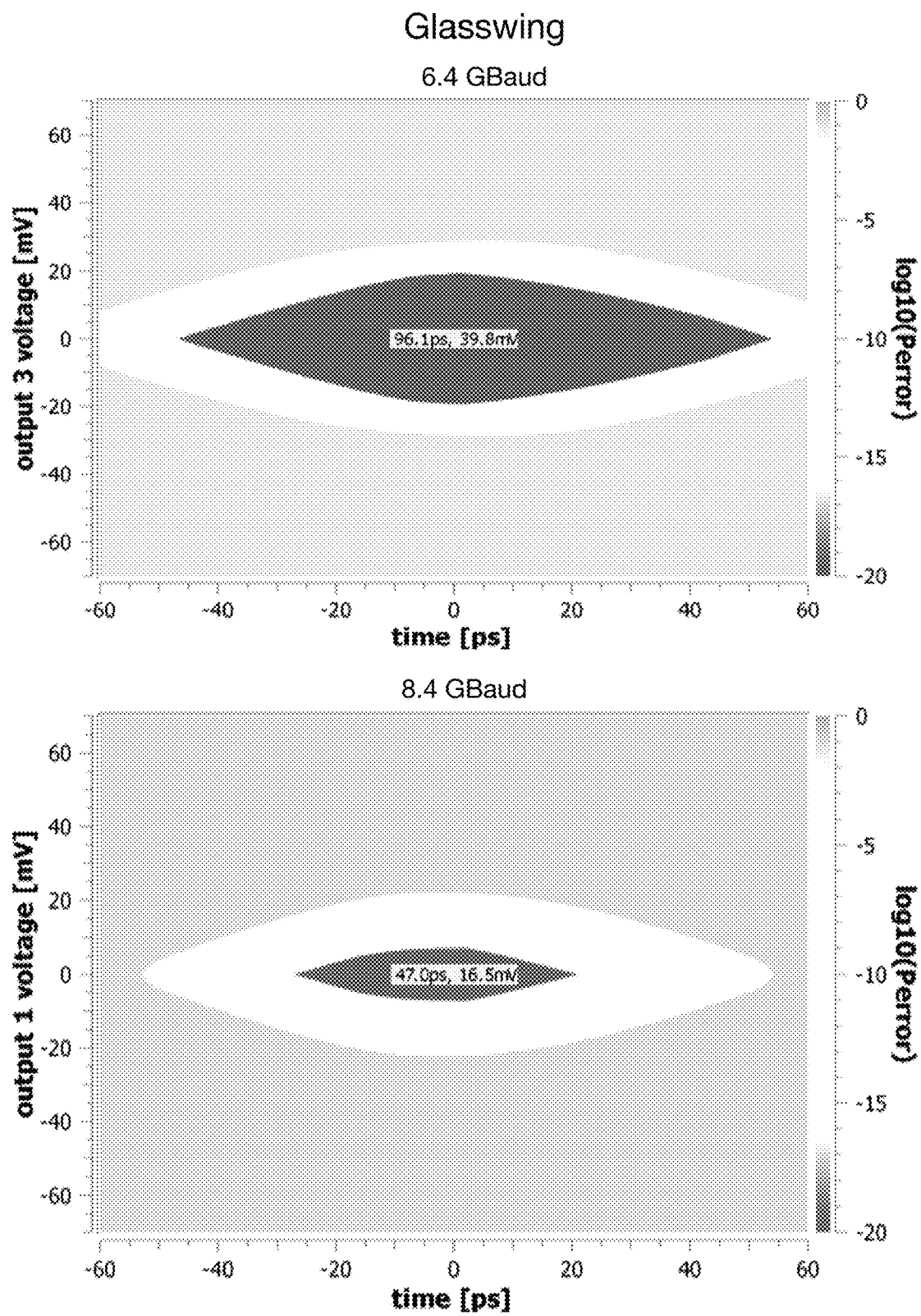
FIGS. 7A, 7B, and 7C shows comparative receive eye diagrams for Glasswing, ENRZ, and 8b9w embodiments, respectively, operating at 6.4 GBaud and 8.4 GBaud signaling rates.
Figure 7B:
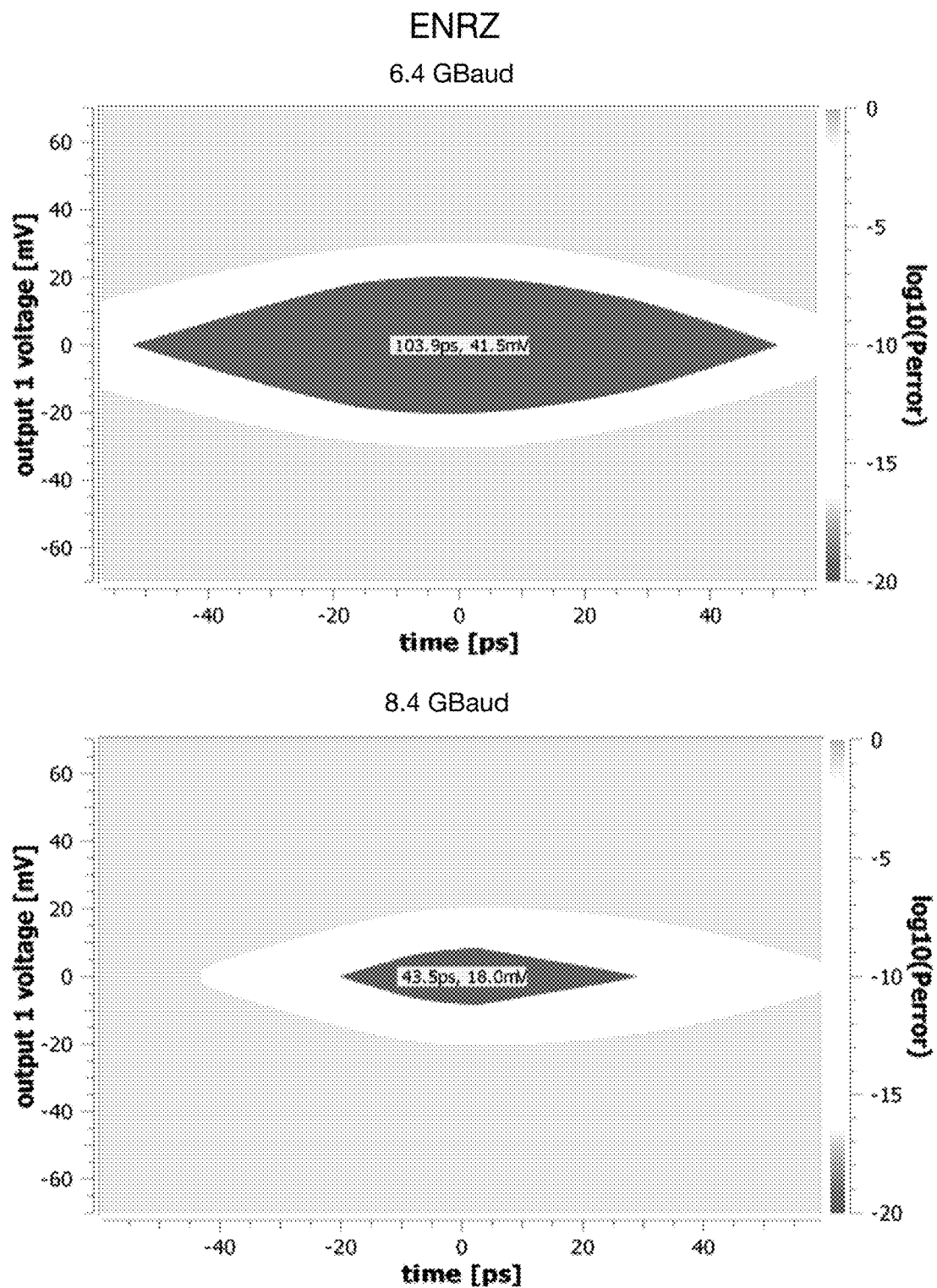
Figure 7C:
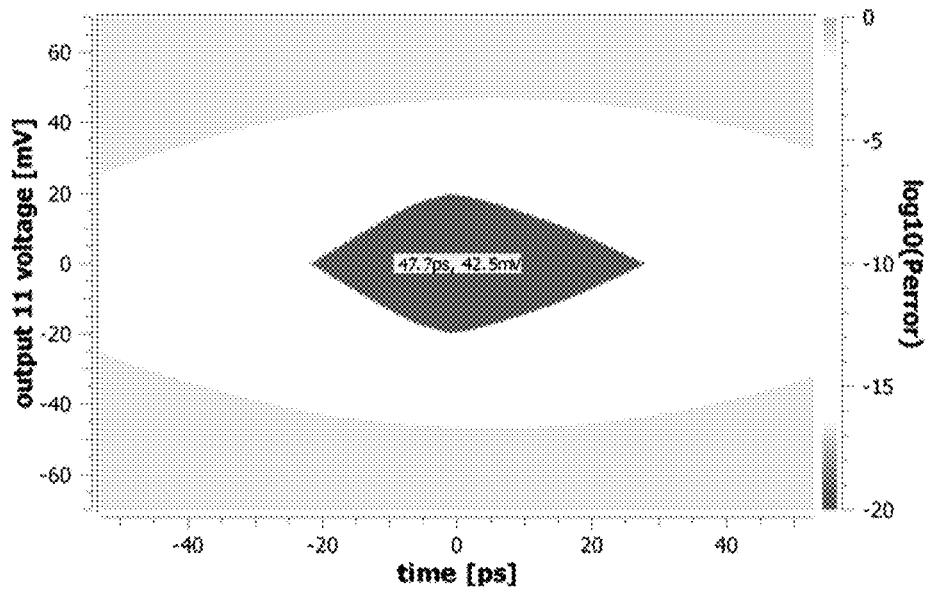
Figure 7C:
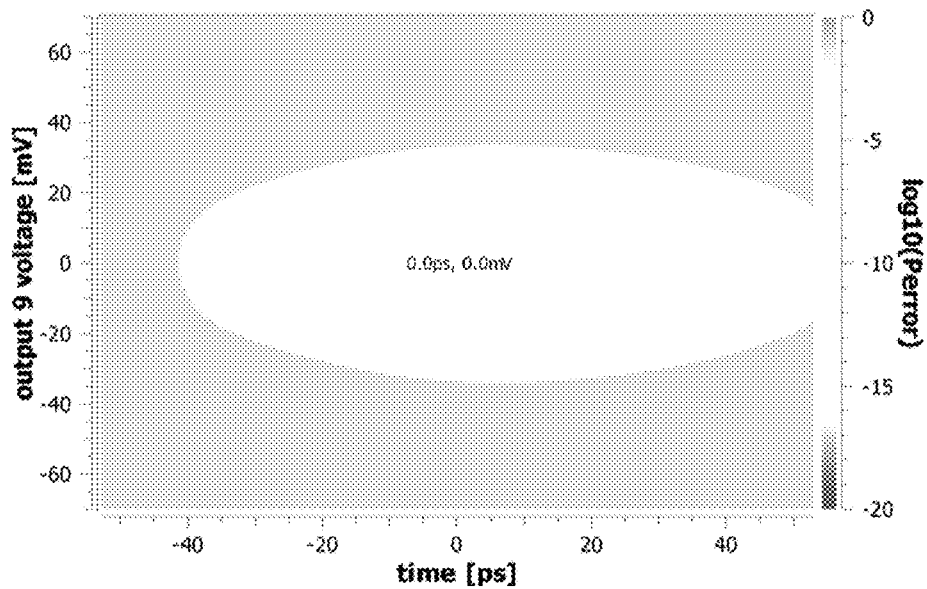
Figure 8:
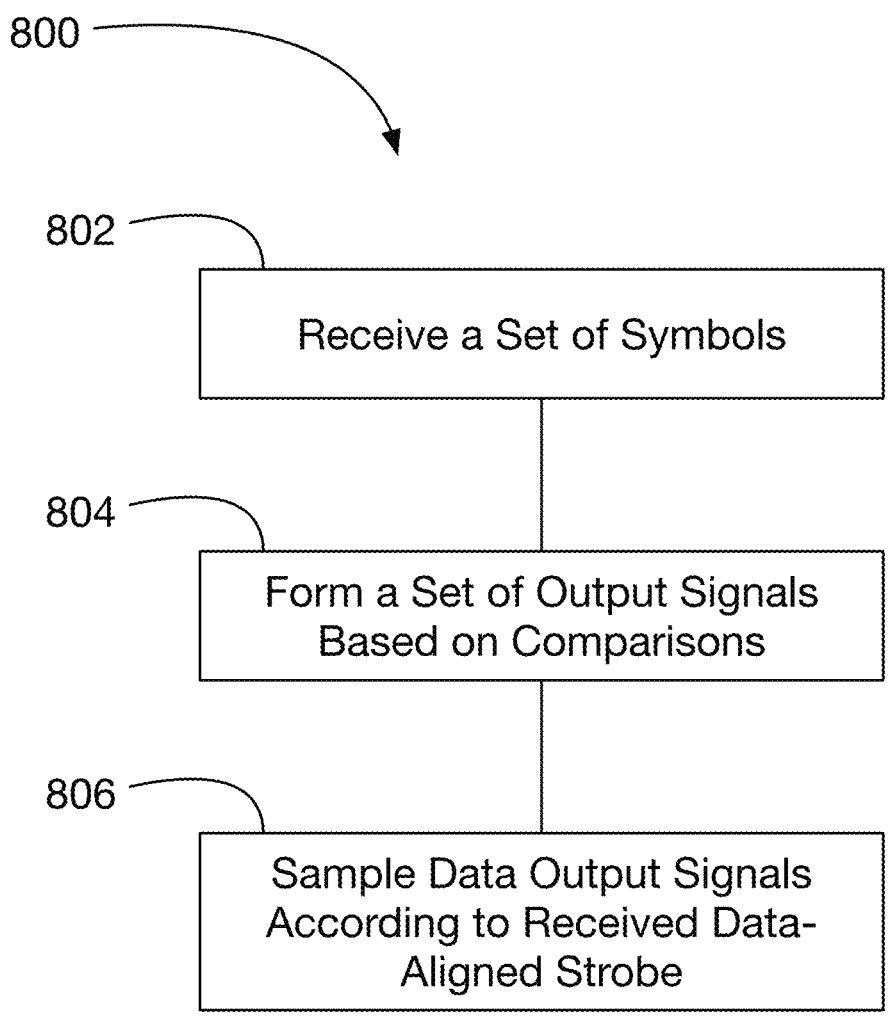
FIG. 8 depicts a process in accordance with at least one embodiment.

FIGS. 7A, 7B, and 7C provide a comparison of the various embodiments; with receive eye diagrams shown for Glasswing, ENRZ, and 8b9w embodiments, respectively, at signaling rates of 6.4 GBaud and 8.4 GBaud.

The examples presented herein illustrate the use of vector signaling codes for point-to-point wire communications. However, this should not been seen in any way as limiting the scope of the described embodiments. The methods disclosed in this application are equally applicable to other communication media including optical and wireless communications. Thus, descriptive terms such as "voltage" or "signal level" should be considered to include equivalents in other measurement systems, such as "optical intensity", "RF modulation", etc. As used herein, the term "physical signal" includes any suitable behavior and/or attribute of a physical phenomenon capable of conveying information. Physical signals may be tangible and non-transitory.

Embodiments

In at least one embodiment, a method 800 comprises receiving, at step 802, a set of symbols of a codeword of a vector signaling code at a plurality of multi-input comparators (MICs), the set of symbols representing a transformation of an input vector with a non-simple orthogonal or unitary matrix, the input vector comprising a plurality of sub-channels, wherein at least one sub-channel corresponds to an input data signal and wherein at least one sub-channel corresponds to a data-aligned strobe signal, forming, at step 802 a set of MIC output signals based on a plurality of comparisons between a plurality of subsets of symbols of the codeword, wherein for each comparison, each subset of symbols has a set of input coefficients applied to it determined by a corresponding MIC, and wherein the set of MIC output signals comprises at least one data output signal and at least one received data-aligned strobe signal, and sampling, at step 806, the at least one data output signal according to the at least one received data-aligned strobe signal.

In at least one embodiment, at least one data output signal is sampled on a rising edge of at least one received data-aligned strobe signal. In another embodiment, at least one output data signal is sampled on a falling edge of at least one received data-aligned strobe signal.

In at least one embodiment, the input vector comprises 4 sub-channels corresponding to input data signals and 1 sub-channel corresponding to a data-aligned strobe signal. In at least one embodiment, each symbol of the set of symbols has a value selected from a set of at least two values. In a further embodiment, each symbol of the set of symbols has a value selected from the set of values $\{+1, +\frac{1}{3}, -\frac{1}{3}, -1\}$.

In at least one embodiment, the sets of input coefficients for each MIC are determined by the non-simple orthogonal or unitary matrix.

In at least one embodiment, the codeword is balanced.

In at least one embodiment, the method further comprises forming a set of output bits by slicing the set of MIC output signals.

In at least one embodiment, the method further comprises receiving the input vector on a plurality of wires, generating, using an encoder, the set of symbols of the codeword representing a weighted sum of sub-channel vectors, the sub-channel vectors corresponding to rows of the non-simple orthogonal or unitary matrix, wherein a weighting of each sub-channel vector is determined by a corresponding input vector sub-channel, and providing the symbols of the codeword on a multi-wire bus.

In at least one embodiment, an apparatus comprises a multi-wire bus configured to receive a set of symbols of a codeword of a vector signaling code, the set of symbols representing a transformation of an input vector with a non-simple orthogonal or unitary matrix, the input vector comprising a plurality of sub-channels, wherein at least one sub-channel corresponds to an input data signal and wherein at least one sub-channel corresponds to a data-aligned strobe signal, a plurality of multi-input comparators (MICs) configured to form a set of MIC output signals based on a plurality of comparisons between a plurality of subsets of symbols of the codeword, wherein for each comparison, each subset of symbols has a set of input coefficients applied to the subset determined by a corresponding MIC, and wherein the set of MIC output signals comprises at least one data output signal and at least one received data-aligned strobe signal, and a plurality of sampling circuits configured to sample the at least one data output signal according to the at least one received data-aligned strobe signal.

In at least one embodiment, at least one sampling circuit is configured to sample at least one data output signal on a rising edge of at least one received data-aligned strobe signal. In another embodiment, at least one sampling circuit is configured to sample at least one output data signal on a falling edge of at least one received data-aligned strobe signal.

In at least one embodiment, the input vector comprises 4 sub-channels corresponding to input data signals and 1 sub-channel corresponding to a data-aligned strobe signal. In at least one embodiment, each symbol of the set of symbols has a value selected from a set of at least two values. In a further embodiment, each symbol of the set of symbols has a value selected from the set of values $\{+1, +\frac{1}{3}, -\frac{1}{3}, -1\}$.

In at least one embodiment, the sets of input coefficients of each MIC are determined by the non-simple orthogonal or unitary matrix.

In at least one embodiment, the codeword is balanced.

In at least one embodiment, the apparatus further comprises a plurality of slicers configured to generate a set of output bits by slicing the set of MIC output signals.

In at least one embodiment, an apparatus comprises a plurality of wires configured to receive an input vector, the input vector comprising a plurality of sub-channels, wherein at least one sub-channel corresponds to a data signal, and wherein at least one sub-channel corresponds to a data-aligned strobe signal, an encoder configured to generate a set of symbols of a codeword representing a weighted sum of sub-channel vectors, the sub-channel vectors corresponding to rows of a non-simple orthogonal or unitary matrix, wherein a weighting of each sub-channel vector is determined by a corresponding input vector sub-channel, and a plurality of line drivers configured to transmit the symbols of the codeword on a multi-wire bus.

We claim:

1. A method comprising:
    obtaining a set of inputs comprising at least one input data signal and at least one clock signal, wherein the at least one clock signal is data-aligned to the at least one input data signal;
    generating symbols of a codeword of a balanced vector signaling code wherein all symbols of any given codeword sum to zero, the symbols representing a transformation of the set of inputs with a plurality of mutually orthogonal sub-channel vectors that collectively form an orthogonal matrix, each sub-channel vector weighted by a respective input of the set of inputs; and
    transmitting each symbol of the codeword as an analog signal over a respective wire of a multi-wire bus.

2. The method of claim 1, wherein the symbols of the codeword of the vector signaling code have symbol values selected from at least a ternary alphabet.

3. The method of claim 2, wherein the at least ternary alphabet is a quaternary alphabet comprising a set of symbol values $\pm 1, \pm \frac{1}{3}$.

4. The method of claim 1, wherein the clock signal weights a sub-channel vector of the plurality of mutually orthogonal sub-channel vectors that affects all wires of the multi-wire bus.

5. The method of claim 1, wherein the clock signal weights a sub-channel vector of the plurality of mutually orthogonal sub-channel vectors that affects two wires of the multi-wire bus.

6. The method of claim 1, wherein the plurality of mutually orthogonal sub-channel vectors are distinct, orthogonal permutations of a vector [+1 +1 −1 −1].

7. The method of claim 1, wherein the clock signal weights a sub-channel vector having equal magnitude elements.

8. The method of claim 1, wherein the clock signal transitions no more than one time per unit interval.

9. An apparatus comprising:
an encoder configured to obtain a set of inputs comprising at least one input data signal and at least one clock signal, wherein the at least one clock signal is data-aligned to the at least one input data signal, and to responsively generate symbols of a codeword of a balanced vector signaling code wherein symbols of any given codeword sum to zero, the symbols representing a transformation of the set of inputs with a plurality of mutually orthogonal sub-channel vectors that collectively form an orthogonal matrix, each sub-channel vector weighted by a respective input of the set of inputs; and
a plurality of drivers configured to transmit each symbol of the codeword as an analog signal over a respective wire of a multi-wire bus.

10. The apparatus of claim 9, wherein the symbols of the codeword of the vector signaling code have symbol values selected from at least a ternary alphabet.

11. The apparatus of claim 10, wherein the at least ternary alphabet is a quaternary alphabet comprising a set of symbol values $\pm 1$, $\pm 1/3$.

12. The apparatus of claim 9, wherein the clock signal weights a sub-channel vector of the plurality of mutually orthogonal sub-channel vectors that affects all wires of the multi-wire bus.

13. The apparatus of claim 9, wherein the clock signal weights a sub-channel vector of the plurality of mutually orthogonal sub-channel vectors that affects two wires of the multi-wire bus.

14. The apparatus of claim 9, wherein the plurality of mutually orthogonal sub-channel vectors are distinct, orthogonal permutations of a vector [+1 +1 −1 −1].

15. The apparatus of claim 9, wherein the clock signal weights a sub-channel vector having equal magnitude elements.

16. The apparatus of claim 9, wherein the clock signal transitions no more than one time per unit interval.

* * * * *